US005317267A

United States Patent [19]

Miyata et al.

[11] Patent Number: 5,317,267

[45] Date of Patent: May 31, 1994

[54] SPARK PLUG VOLTAGE PROBE FOR USE WITH AN INTERNAL COMBUSTION ENGINE

[75] Inventors: Shigeru Miyata; Hideji Yoshida; Yoshihiro Matsubara; Yasuo Ito; Takashi Suzuki, all of Nagoya, Japan

[73] Assignee: NGK Spark Plug Co., Ltd., Nagoya, Japan

[21] Appl. No.: 866,812

[22] Filed: Apr. 9, 1992

[30] Foreign Application Priority Data

| | | | |
|---|---|---|---|
| Apr. 12, 1991 | [JP] | Japan | 3-080107 |
| Jun. 14, 1991 | [JP] | Japan | 3-143531 |
| Jun. 14, 1991 | [JP] | Japan | 3-143532 |
| Jul. 8, 1991 | [JP] | Japan | 3-167127 |

[51] Int. Cl.[5] .................... F02P 17/00; G01R 19/165; G01R 1/06; G01R 15/00

[52] U.S. Cl. .................................... 324/402; 324/126; 324/149; 324/393

[58] Field of Search ...................... 324/72.5, 126, 133, 324/149, 388, 390, 391, 393-395, 399, 402, 530; 73/117.3

[56] References Cited

U.S. PATENT DOCUMENTS

| | | | |
|---|---|---|---|
| 2,408,045 | 9/1946 | Cottrell | 324/72.5 UX |
| 3,711,767 | 1/1973 | Campbell, Jr. et al. | 324/530 X |
| 4,041,373 | 8/1977 | Maringer | 324/126 X |
| 4,052,665 | 10/1977 | Gruenwald | 324/402 X |
| 4,349,782 | 9/1982 | Doss | 324/395 X |
| 4,783,991 | 11/1988 | Wixon | 73/117.3 |
| 5,001,432 | 3/1991 | Wixon | 324/402 |

FOREIGN PATENT DOCUMENTS

| | | | |
|---|---|---|---|
| 0277468 | 8/1988 | European Pat. Off. . | |
| 2356440 | 5/1975 | Fed. Rep. of Germany . | |
| 3306431 | 8/1984 | Fed. Rep. of Germany | 324/402 |
| 52-118135 | 10/1977 | Japan . | |
| 557088 | 11/1943 | United Kingdom | 324/530 |

*Primary Examiner*—Gerard R. Strecker
*Attorney, Agent, or Firm*—Cooper & Dunham

[57] ABSTRACT

A spark plug voltage probe detects a voltage applied to a spark plug installed in an internal combustion engine so as to analyze a burning condition in the internal combustion engine on the basis of the voltage applied to the spark plug. A rubber collar (74) is provided to surround a rubber cap (7) which is secured to a high tension terminal (71*a*) of the spark plug (71) so as form a static capacity between the high tension terminal (71*a*) and the rubber collar (74). An electrical conductor (73) is provided between the rubber cap (7) and the rubber collar (74) and is electrically connected to a microcomputer by way of an output cable (64).

1 Claim, 15 Drawing Sheets

SPARK PLUG VOLTAGE PROBE FOR USE WITH AN INTERNAL COMBUSTION ENGINE

BACKGROUND OF THE INVENTION

Field of the Invention

The invention relates to a spark plug voltage probe in which a lead wire is provided through an insulation to electrically connect a high voltage induced by an ignition coil to a spark plug in an internal combustion engine, and detecting a voltage applied across the spark plug.

With the demand of purifying emission gas and enhancing fuel efficiency of internal combustion engines, it has been necessary to detect firing condition in each cylinder of the internal combustion engine. In order to detect the firing condition in each of the cylinders, an optical sensor has been installed within the cylinders on one hand. On the other hand, a piezoelectrical sensor has been attached to a seat pad of the spark plug.

In both cases, it is troublesome and time-consuming to install the sensor to each of the cylinders, thus increasing the installation cost, and at the same time, taking much time in check and maintenance.

Therefore, it is an object of the invention to provide a spark plug voltage probe which is capable of precisely detecting a voltage applied to the spark plug installed to each cylinder of the internal combustion engine with a relatively simple structure.

SUMMARY OF THE INVENTION

According to the invention, there is provided a spark plug voltage probe for internal combustion engine comprising: a lead wire provided through an insulator; an electrical conductor provided in an ignition circuit in proximity of the lead wire of a secondary circuit which supplies high voltage to a spark plug in an internal combustion engine by way of the lead wire; a condensor connected between the electrical conductor and the ground; and a secondary voltage detector circuit which divides a secondary voltage in accordance with a static capacity of the condensor and a static capacity between the electrical conductor and the lead wire which is provided through the insulator.

In order to have the static capacity between the lead wire and the electrical conductor, the electrical conductor is provided on one part of the lead wire which is included to the secondary circuit which supplies high voltage from the ignition circuit to the spark plug directly or by way of distributor. By connecting the condensor to the electrical conductor, the sensor portion of the secondary voltage detector circuit is formed.

The secondary voltage detector circuit precisely picks up a waveform of a secondary voltage which is applied across the spark plug. Analyzing the waveform makes it possible to distinguish normal ignition from misfire and misspark of the spark plug, and feeding the analyzed information back to a combustion control means to give a warning of worsened emission gas and deteriorated catalyst.

In accordance with an independent aspect of the invention, there is provided a spark plug voltage probe for internal combustion engine comprising: a shunt detector circuit including an electrical conductor provided in an ignition circuit in proximity of a secondary circuit so as to have a predetermined static capacity therebetween, and a condensor electrically connected to the sensor portion, the secondary circuit supplying high voltage to a spark plug in an internal combustion engine by way of the lead wire which is provided through an insulator; a secondary voltage detector circuit which detects a secondary voltage waveform divided by the shunt detector circuit; a distinction circuit which analyzes the secondary voltage waveform, and feeding back to a control portion being disposed in proximity of an electrode plate which is arranged along a groove which is provided with an insulator base, the lead wire being placed within the groove through the insulator.

The secondary circuit, which supplies the secondary voltage to the spark plug, causes a substantially uniform capacity to exist between the lead wire and the electrode plate, thus making it possible to precisely detect the secondary voltage waveform with a single sensor portion.

In a spark plug voltage probe for internal combustion engine, a cavity is further provided on a lower surface of the insulator base to install the condensor, the secondary voltage detector circuit and the distinction circuit.

With the cavity provided on the lower surface of the insulator base, the condensor, the voltage detector circuit and the distinction circuit are integrally located in the cavity for the convenience of matching, adjustment and maintenance for those circuits.

These and other objects and advantages of the invention will be apparent upon reference to the following specification, attendant claims and drawings.

DETAILED DESCRIPTION OF THE EMBODIMENTS

Figure 1:
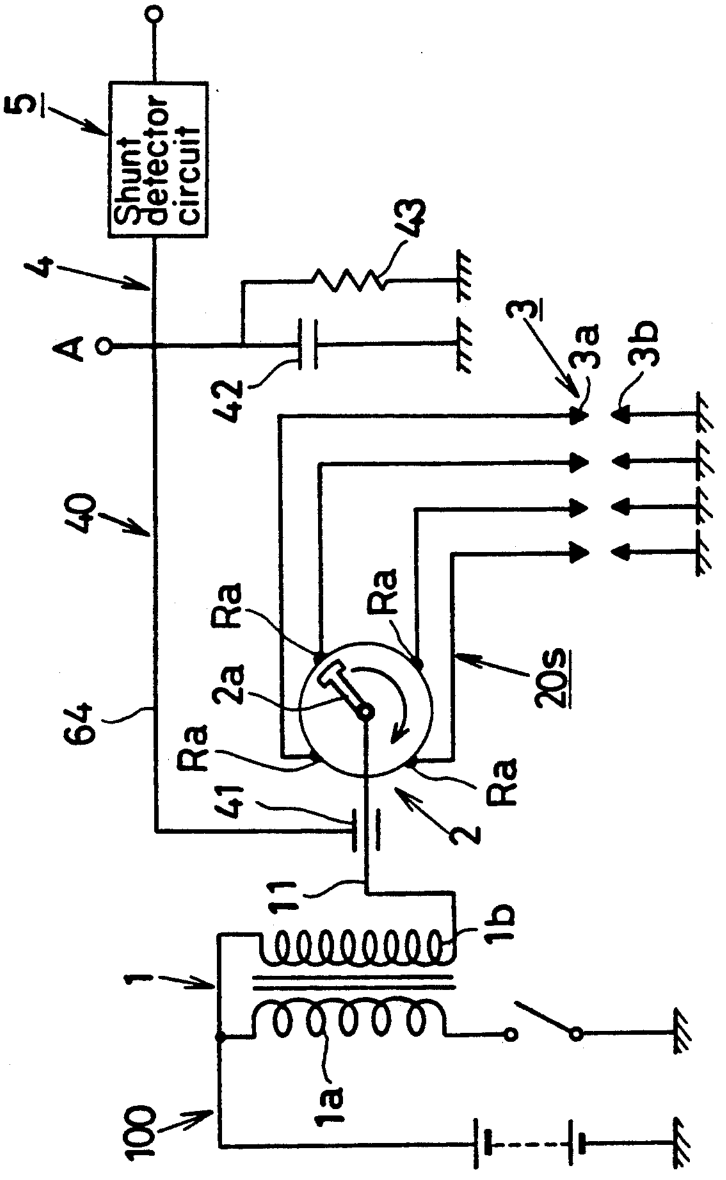
FIG. 1 is a schematic view of an ignition circuit having a spark plug voltage detector circuit for internal combustion engine.

Referring to FIG. 1, there is provided an ignition circuit 100 for internal combustion engine which includes an ignition coil 1 having a primary coil 1*a* and a secondary coil 1*b*. A high tension cord 11, which means a lead wire provided through an insulator hereinafter has one end electrically connected to the secondary coil 1*b*, and having the other end connected to a rotor 2*a* of a distributor 2 which integrally incorporates a contact breaker (not shown) and has e.g. four stationary segments (Ra). To each of the stationary segments (Ra), a free end of the rotor 2*a* approaches to make a series gap (e.g. 0.30 mm in width) with the corresponding segments (Ra) during the rotary movement of the rotor 2*a*. To each of the four stationary segments (Ra), is a center electrode 3*a* of a spark plug 3 electrically connected which is installed in each of four cylinders of the internal combustion engine. In this instance, a secondary circuit 20*s* is formed by providing an electrical path from the distributor 2 to the spark plug 3. The spark plug 3 has an outer electrode 3*b* electrically connected to the ground so that the secondary coil 1*b* energizes each of the spark plugs 3 by way of the high tension cord 11, the rotor 2*a* and each of the stationary segments (Ra) of the distributor 2.

Around the high tension cord 11 which is provided to electrically connect the secondary coil 1*b* to the distributor 2, is an electrical conductor 41 placed to form a secondary voltage detector 4 which includes a shunt condensor 42 and a shunt detector circuit 5. The shunt condensor 42 has one end connected to the electrical conductor 41, and having the other end connected to the ground to provide a sensor circuit portion (sensor portion) 40. In parallel with the shunt condensor 42, is an electrical resistor 43 (e.g. 500KΩ) connected to form a discharge circuit for the shunt condensor 42. The shunt detector circuit 5 is connected at a common point between the electrical conductor 41 and the shunt condensor 42.

The electrical conductor 41 is in the shape of a metallic tube 63 (e.g. 2 cm in length) surrounding the high tension cord 11 to provide a static space therebetween. The metallic tube 63 is air-tightly embedded in a rubber sleeve 62 as described in FIG. 3 hereinafter.

The shunt condensor 42 has a capacity of 10000 pF, while the static space between the metallic tube and the high tension cord 11 allows a capacity of 5 pF. The sensor circuit portion 40 divides spark plug voltage across the high tension cord 11 by the order of 1/2000 in which high voltage of about 20000 volt is reduced to the level of 10 volt since the spark plug voltage is divided in accordance with a ratio of static capacity of the electrical conductor 41 to that of the shunt condensor 42. An electric frequency of the high voltage is within the range of 10 KHz so that the impedance of the sensor circuit portion 40 comes to about 1.6KΩ which substantially makes the resistor 43 immune to the value of the divided voltage.

In the shunt detector circuit 5, the circuit 5 has a processor circuit including a microcomputer or a pulse-width distinction circuit although not shown.

Figure 2:
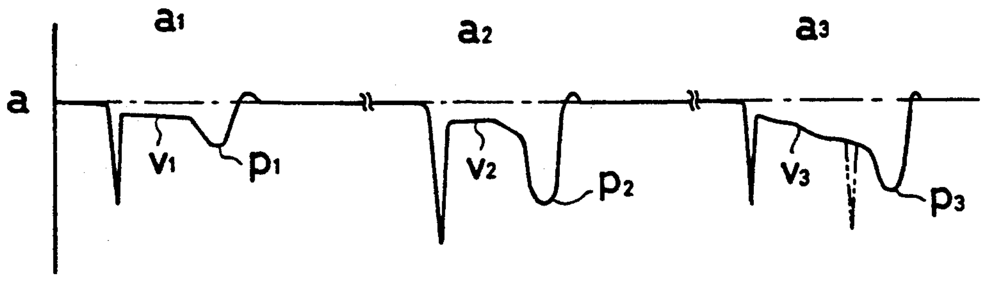
FIG. 2 shows waveform for the purpose of explaining how the spark plug voltage detector circuit works.

A voltage waveform obtained from an intermediate point (A) between the electrical conductor 41 and the shunt condensor 42 has a capacity discharge component followed by an inductive discharge component as shown at (a) in FIG. 2 which is a voltage waveform equivalent to that of the spark plug voltage directly divided in accordance with a ratio of static capacity of the electrical conductor 41 to that of the shunt condensor 42.

The inductive discharge component, changes the spark plug voltage waveform since an electrical resistance of a spark gap between the electrodes 3*a*, 3*b* varies from the case in which spark occurs between the electrodes 3*a*, 3*b*, and ignites air-fuel mixture gas in the cylinder to the case in which spark occurs between the electrodes 3*a*, 3*b*, but fails to ignite the air-fuel mixture gas.

When the spark normally ignites the air-fuel mixture gas to generate combustion gas which is ionized at or around the spark gap to decrease the electrical resistance between the electrodes 3*a*, 3*b*, the decreased electrical resistance causes a capacity discharge in an order of 100 amperes for about 1 manoseconds followed by the inductive discharge in an order of 50 milliampere at low voltage (V1). This is maintained about 1 milliseconds until all the electrical energy stored in the ignition coil 1 has released.

The completion of the inductive discharge is followed by a low peak voltage (P1) as shown at (a1) in FIG. 2.

When the spark fails to ignite the air-fuel mixture gas, the electrical resistance between the electrodes 3*a*, 3*b* increases. The increased electrical resistance terminates the inductive discharge for a short period of time to store a greater amount of electrical energy in the ignition coil 1. The greater amount of energy stored in the ignition coil 1 completes the capacity discharge followed by the inductive discharge at low voltage (V2) and accompanies a rapidly increased peak voltage (P2) as shown at (a2) in FIG. 2.

When the spark ignites the air-fuel mixture gas, but strong swirls make the spark errant to lengthen a sustaining time period of the spark, the errant spark interrupts the discharge between the electrodes 3*a*, 3*b* and destroys the insulation of the spark gap between the electrodes 3*a*, 3*b*.

In this situation, the completion of the capacity discharged is followed by the inductive discharge at progressively increasing voltage (V3) and by the capacity discharge again to represent an intermediate peak voltage (P3) after completing the discharge as shown at (a3) in FIG. 2.

When the spark normally ignites the air-fuel mixture gas, it is adapted to generate a single short pulse.

When the spark fails to ignite the air-fuel mixture gas, it is adapted to simultaneously produce a short pulse and a wider pulse.

When the spark ignites the air-fuel mixture gas, but strong swirls make the spark errant to lengthen a sustaining time period of the spark, the errant spark either increases the inductive discharge level or induces the capacity discharge again, and thus adapted to produce pulses different from the above two cases.

Figure 3:
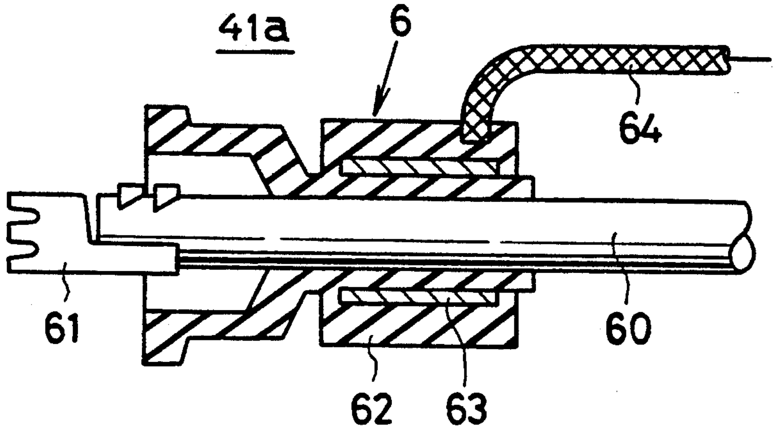
FIG. 3 is a longitudinal cross-sectional view with an electrical conductor mounted on a high tension cord.

FIG. 3 shows a spark plug voltage probe device 41*a* to a plug cable 60 which is substantially equivalent to the high tension cord 11. The plug cable 60 carries a connection cap 6 which is secured to either the ignition coil 1 or the distributor 2 by way of a terminal 61. The connection cap 6 has the rubber sleeve 62 which is integrally extended toward an opposite side of the terminal 61 so as to air-tightly surround the plug cable 60. In the rubber sleeve 62, is the metallic tube 63 concentrically embedded, to an outer surface of which an output cable 64 is electrically connected.

Figure 4:
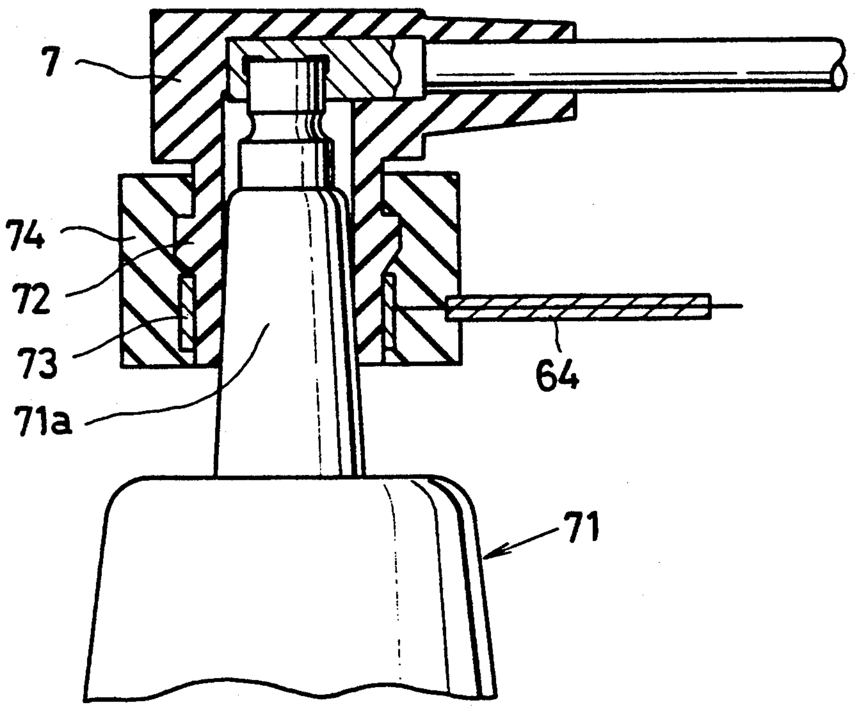
FIG. 4 is a second modification form of the electrical conductor.

FIG. 4 shows a first modification form of the electrical conductor 41.

In FIG. 4, a rubber cap 7 is secured to a high tension terminal 71*a* of a spark plug 71. From a lower end of the rubber cap 7, is a boot 72 integrally extended which is tightly surrounded by a plastic or rubber collar 74. Between the boot 72 and the collar 74, is a metallic tube 73 fixedly placed to work as an electrical conductor.

Figure 5:
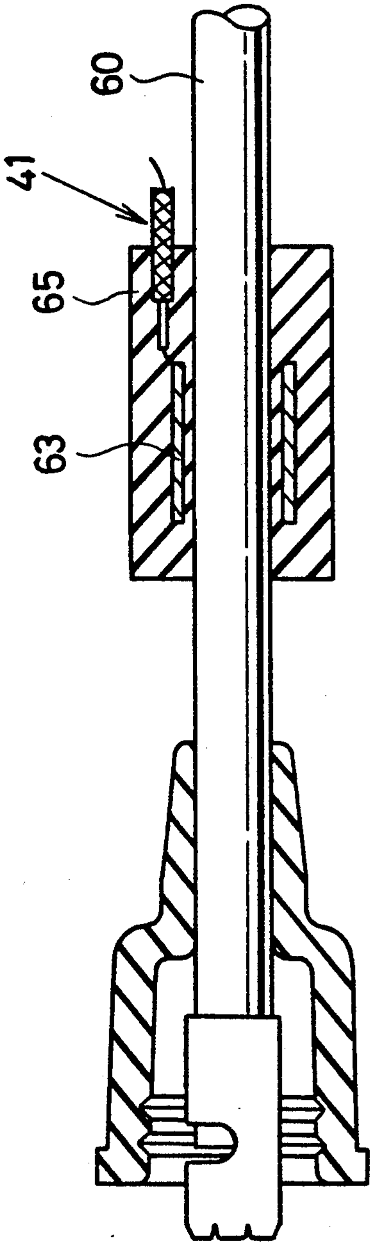
FIG. 5 is a third modification form of the electrical conductor.

FIG. 5 shows a second modification form of the electrical conductor 41.

In FIG. 5, the plug cable 60 is sourrounded by a plastic or rubber sleeve 65 in which the metallic tube 63 is embedded.

Figure 6:
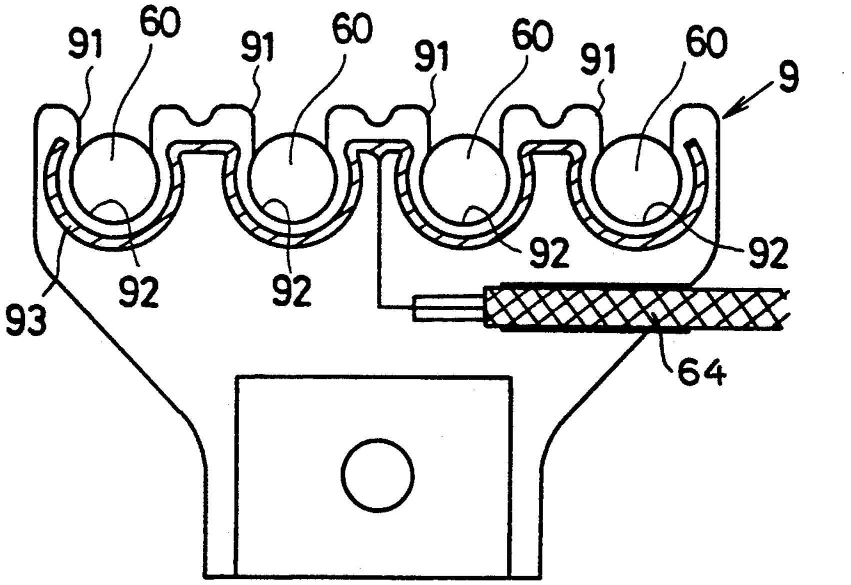
FIG. 6 is a fourth modification form of the electrical conductor.

FIG. 6 shows a third modification form of the electrical conductor 41.

In FIG. 6, a plastic or rubber clamper 9 is provided which is secured to the internal combustion engine. The clamper 9 has a plurality of grooves 92 in each of which the plug cable 60 is located. Along the grooves 92 of the clamper 9, is a metallic corrugation 93 embedded in the clamper 9 to serve as an electrical conductor.

Figure 7:
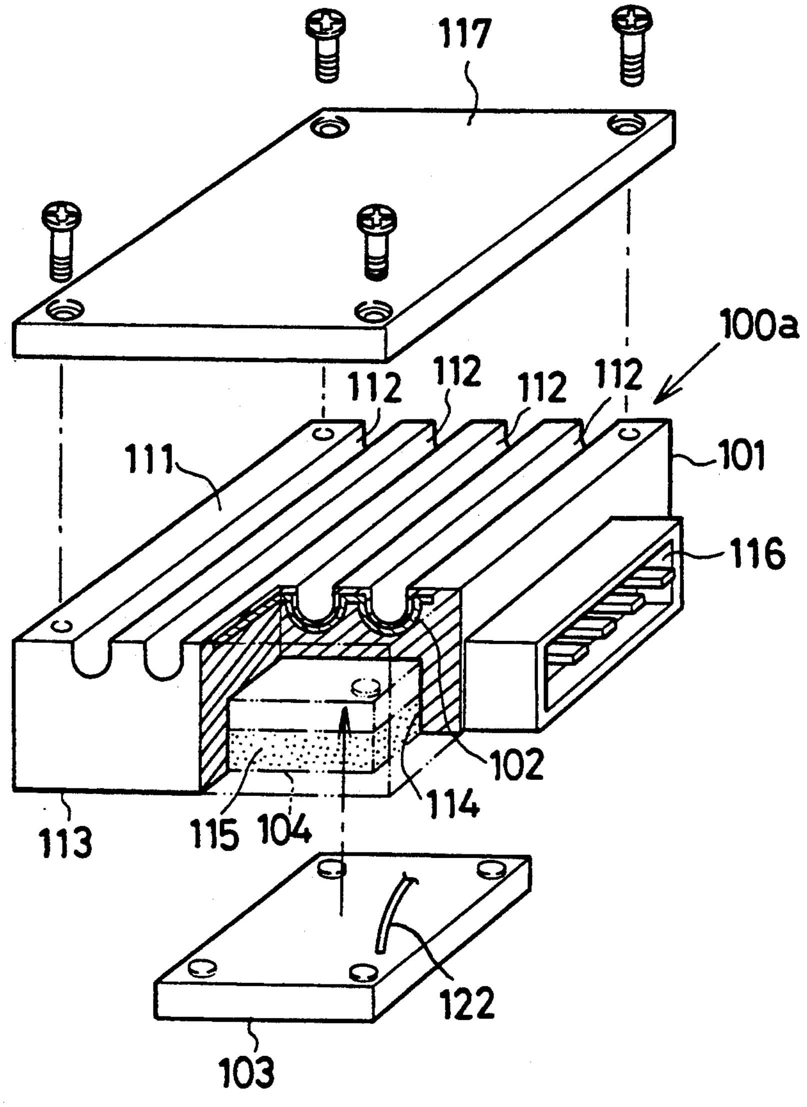
FIG. 7 is a perspective view showing how a spark plug voltage detector is installed in a cavity of an insulator base according to a second embodiment of the invention.

FIG. 7 shows a second embodiment of the invention in which a spark plug voltage probe 100*a* is depicted. Numeral 101 designates an insulator base which is made in the shape of parallelepiped from synthetic resin. An upper surface 111 of the insulator base 101 has U-shaped grooves 112 in parallel relationship each other, the number of which corresponds to the number of the cylinders of the internal combustion engine. A lower surface 113 of the insulator base 101 has a rectangular cavity 114 to provide an accommodation space 115, while one sidewall of the insulator base 101 provides an outlet 116 for connecting an output line and a power source.

Figure 8:
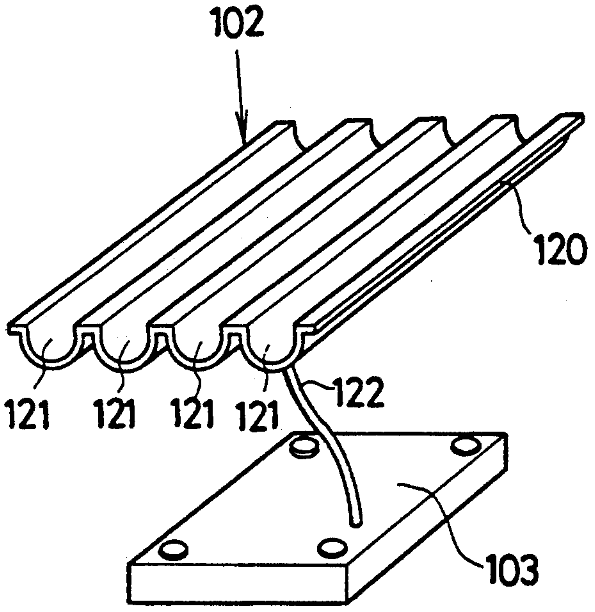
FIG. 8 is an exploded view of an electrode plate and a circuit base.

As FIG. 8 shows, along the grooves 112 of the insulator base 101, is a corrugated metal 120 embedded in the insulator base 101 to form a spark plug voltage sensor 102 in a manner that each recess 121 of the corrugated metal 120 corresponds to each of the grooves 112. The corrugated metal 120, which acts as an electrode plate is simultaneously embedded at the time of forming the insulator base 101 by means of injection mould.

A lead wire 122 electrically connects the corrugated metal 120 to a shunt condensor, a shunt detector circuit and a distinction circuit each packaged in a package substrate 103. The package substrate 103 fixedly placed within the accommodation space 115 by means of a resin filler 104. It is noted that the recess 121 of the corrugated metal 120 may be polygonal or elliptic, otherwise the electrode plate may be flat without any recess. It is also noted that the corrugated metal 120 may be fixedly placed within the accommodation space 115, or may be deposited layer on a lower side of the package substrate 103 in a form of conductive layer by means of printing. It is also appreciated that the corrugated metal 120 may be embedded in a lid plate 117.

Figure 9:
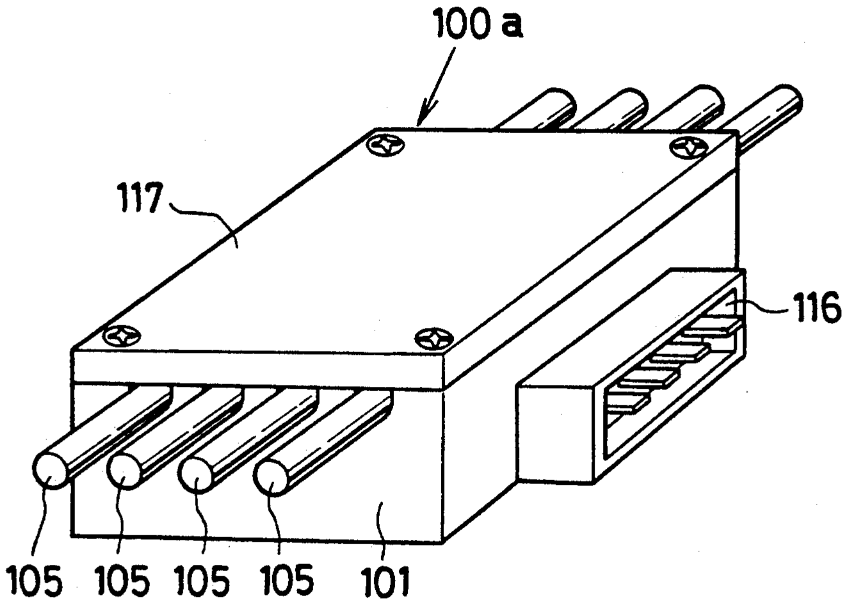
FIG. 9 is a perspective view of the spark plug voltage detector.

As FIG. 9 shows, in each of the grooves 112 of the insulator base 101, a high tension cord 105 is placed which electrically connects a distributor (D) to a spark plug (P) of an internal combustion engine (E) so as to form a secondary circuit in an ignition circuit. On the upper surface 11 of the insulator base 101, is the lid plate 117 fixedly placed to secure the high tension cord 105 against removal.

Figure 10:
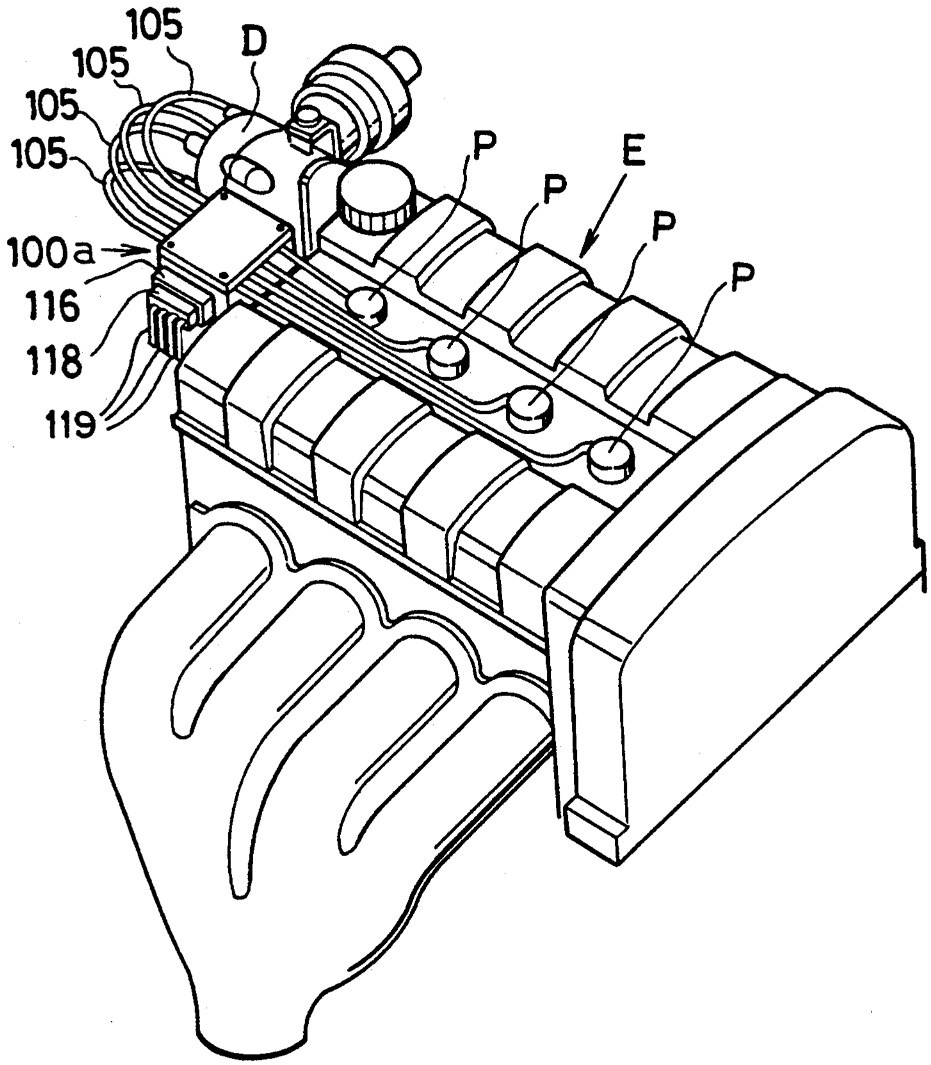
FIG. 10 is a perspective view with the spark plug voltage detector mounted on internal combustion engine.

As FIG. 10 shows, the spark plug voltage probe 100*a* is mounted on the internal combustion engine (E), while a plug 118 is connected to the outlet 116 to introduce a lead wire 119 to the power source.

Figure 11:
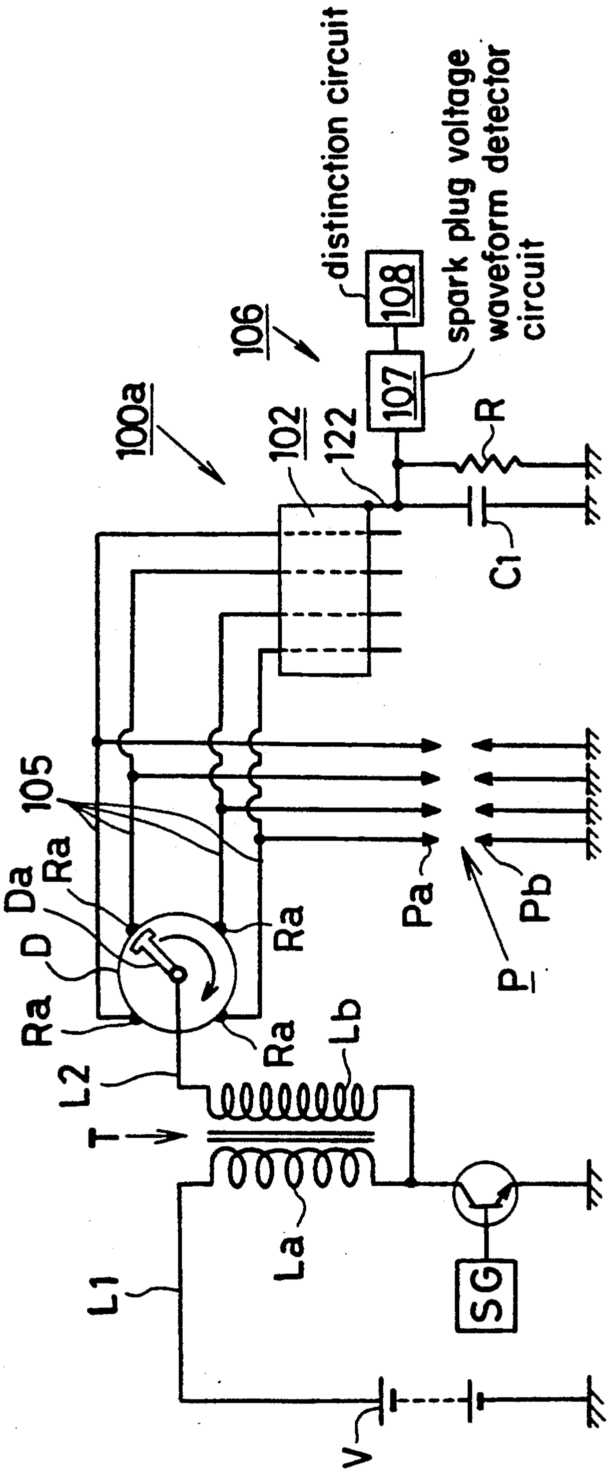
FIG. 11 is a schematic view of an ignition circuit having a spark plug voltage detector circuit for the internal combustion engine.

FIG. 11 shows the ignition circuit into which the spark plug voltage probe 100*a* is incorporated. The ignition circuit has an ignition coil (T) comprising a primary circuit (L1) and a secondary circuit (L2) with a vehicle battery cell (V) as a power source. The primary circuit (L1) has a primary coil (La) electrically connected in series with a signal generator (SG), while the secondary circuit (L2) has a secondary coil (Lb) connected to a rotor (Da) of the distributor (D). The distributor (D) has stationary segments (Ra), the number of which corresponds to that of the cylinders of the internal combustion engine. To each of the stationary segments (Ra), a free end of the rotor 2*a* approaches to make a series gap with each of the segments (Ra). Each of the segments (Ra) is electrically connected to corresponding spark plugs (P) by way of the high tension cord 105. Each of the spark plugs (P) has a center electrode (Pa) and an outer electrode (Pb) to form a spark gap between the two electrodes (Pa), (Pb) across which spark occurs when energized.

Meanwhile, the corrugated metal 120 is electrically connected to the ground by way of a shunt condensor (C1) to form a shunt detector 106 of the spark plug voltage. To a common point between the corrugated metal 120 and the shunt condensor (C), is a spark plug voltage waveform detector circuit 107 connected to which a distinction circuit (microcomputer) 108 is electrically connected.

In the spark plug voltage sensor 102, there is provided static space between the high tension cord 105 and the corrugated metal 120 to define static capacity of e.g. 1 pF. The shunt condensor (C) has static capacity of e.g. 3000 pF and having an electrical resistor R (e.g. 3MΩ) connected in parallel therewith so as to form a discharge path for the shunt condensor (C).

The shunt detector 106 divides the high voltage voltage induced from the secondary circuit (L2) by the order of 1/3000, which makes it possible to determine the time constant of RC-path to be approximately 9 milliseconds to render the change of the high voltage voltage relatively slow.

The spark plug voltage waveform detector circuit 107 analyzes a voltage waveform outputted from the shunt detector 106 which is compared with a characteristic voltage waveform previously determined by calculation or experiment.

The voltage waveform divided in accordance with the spark plug voltage sensor 102 and the shunt condensor (C), directly represents one which is applied to each of the spark plugs (P).

The voltage waveform changes depend on the case when the spark ignites air-fuel mixture gas in the cylinder, and on the case when the spark occurs but fails to ignite the air-fuel mixture gas, and further on the case when the spark fails due to exhausted battery cell, deposit carbon or deterioration of the spark plugs. By analyzing the difference of the changing voltage waveform, it is possible to distinguish normal ignition from misignition and misfire in each cylinder of the internal combustion engine.

The distinction circuit 108 receives the output from the spark plug voltage waveform detector circuit 107, and compares with the characteristic voltage waveform which previously determined by calculation or experiment so as to produce an output which is fed into a main computer or a control means which adjusts injection timing or an amount of fuel injection.

Figure 12:
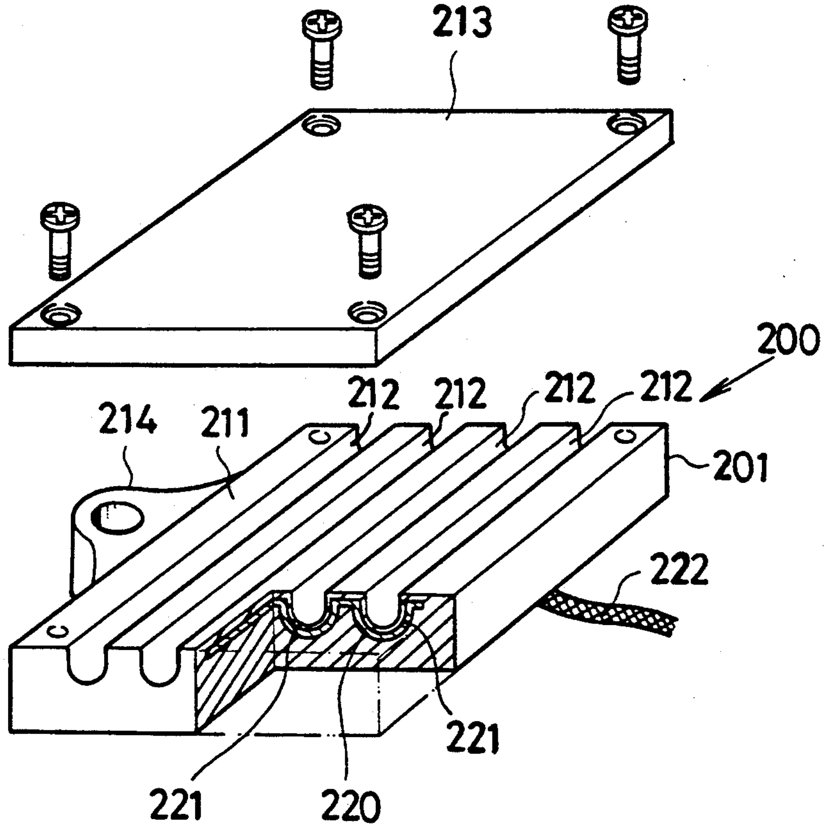
FIG. 12 is a view similar to FIG. 7 according to a third embodiment of the invention.

FIG. 12 shows a third embodiment of the invention in which a spark plug voltage probe 200 is depicted in which an insulator base 201 has no cavity equivalent of the accommodation space 114 of the second embodiment. Instead of the outlet 116 of the second embodiment, an anchor lug 214 is attached to the insulator base 201 so as to fasten the base 201 to the internal combustion engine (E). In the insulator base 201, is a corrugated metal 220 embedded along grooves 212 which are provided with an upper surface 211 of the base 201 in the same manner as described in the second embodiment of the invention. The corrugated metal 220 has recesses 221 corresponding to grooves 212 to serve as an electrode plate.

Figure 13:
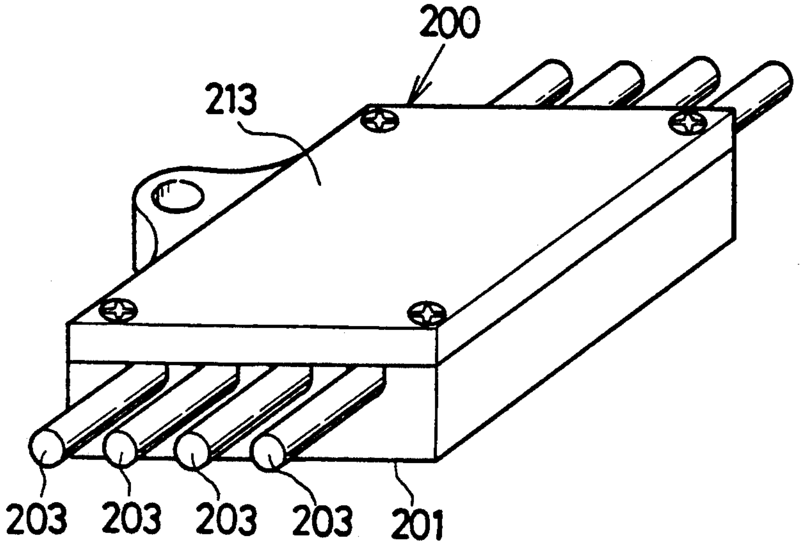
FIG. 13 is a view similar to FIG. 9.
Figure 14:
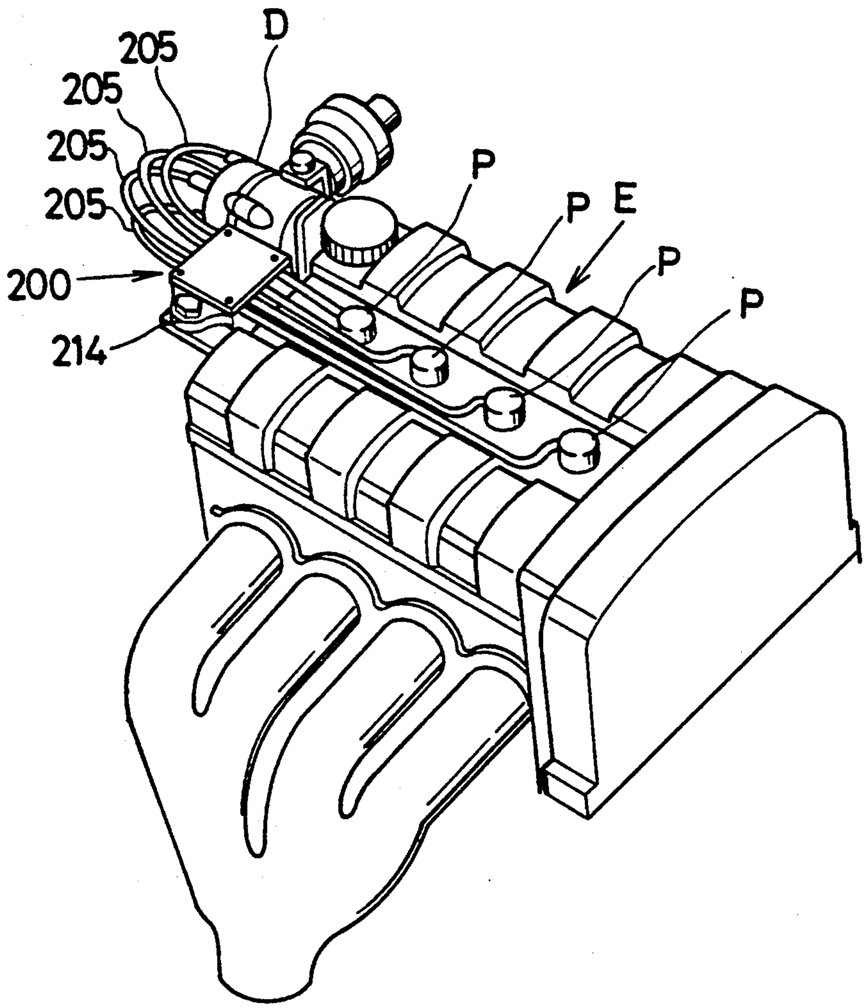
FIG. 14 is a view similar to FIG. 10.

On the upper surface 211 of the base 201, is a lid plate 213 placed to fix a tension cord 203 as shown in FIG. 13. The spark plug voltage probe 200 thus assembled is fasten to the internal combustion engine (E) as shown in FIG. 14.

Figure 15:
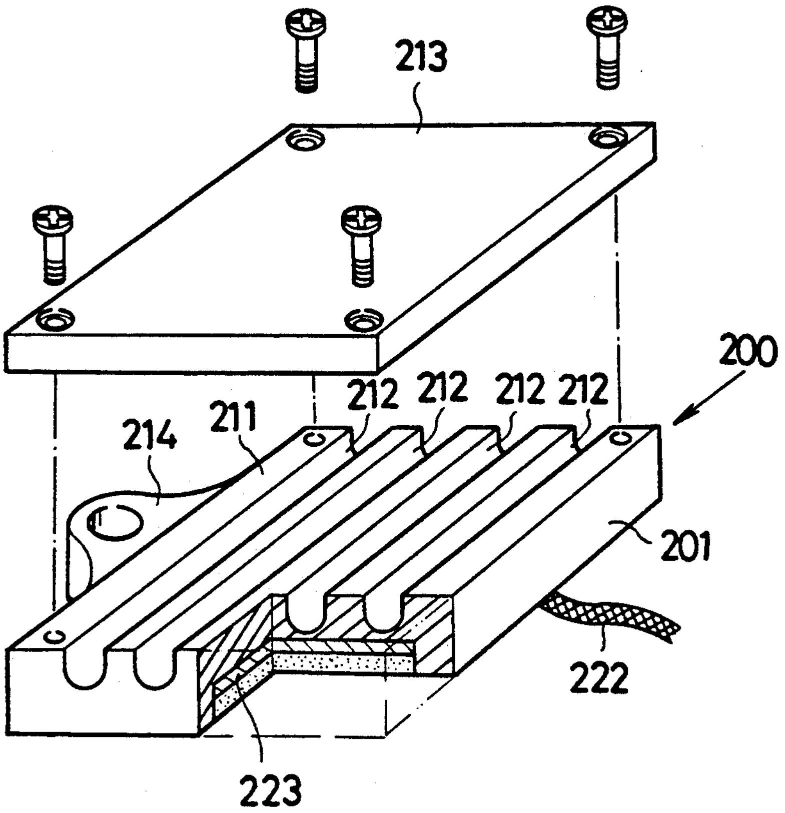
FIG. 15 is a view similar to FIG. 7 according to a modification form of the third embodiment of the invention.

FIG. 15 shows a modification form in which an flat metal sheet 223 is used as an electrode plate in the third embodiment of the invention. The flat metal sheet 223 is readily embedded in the base 201 at the time of moulding the insulator base 201.

It is appreciated that both the insulator base 201 and the lid plate 213 are preferably made of heat-resistant plastic material so as to sufficiently resist against the considerable amount of heat generated from the internal combustion engine.

It is also appreciated that both the insulator base 201 and the lid plate 213 are made of light-weight ceramic material to contribute to reducing an entire weight of the vehicle.

Further, it is noted that an array of grooves may be provided with a lower surface of the lid plate 213 in correspondence to the grooves 212 in a manner that the depth of the array of grooves is less than that of the grooves 212.

While the invention has been described with reference to the specific embodiments, it is understood that this description is not to be construed in a limiting sense in as much as various modifications and additions to the specific embodiments may be made by skilled artisan without departing from the spirit and scope of the invention.

What is claimed is:

1. A spark plug voltage probe which detects a voltage applied to a spark plug installed in an internal combustion engine so as to analyze a burning condition in the internal combustion engine on the basis of the voltage applied to the spark plug, the spark plug voltage probe comprising:

an insulator base (101) secured to the top of the internal combustion engine, an upper surface (111) of the insulator base (101) having a groove (112) in which a spark plug cable (105) is located and a lower surface (113) of the insulator base (101) having a cavity (114) as an accommodation space (115) in which electrical circuits are placed in a package substrate (103) by means of a resin filler (104); and an electrode plate (102) embedded in the insulator base (101) along the groove (112) and electrically connected to the electrical circuits by way of a lead wire (122).

* * * * *